United States Patent [19]

Inoue et al.

[11] 4,284,703

[45] Aug. 18, 1981

[54] PEEL-APART-DEVELOPABLE LIGHT-SENSITIVE MATERIALS AND IMAGE-FORMING METHOD USING THE SAME

[75] Inventors: Eiichi Inoue, Tokyo; Takao Nakayama, Yokohama, both of Japan

[73] Assignee: Fuji Photo Film Co., Ltd., Minami-ashigara, Japan

[21] Appl. No.: 99,811

[22] Filed: Dec. 3, 1979

Related U.S. Application Data

[63] Continuation of Ser. No. 810,828, Jun. 28, 1977, abandoned.

[30] Foreign Application Priority Data

Jun. 28, 1976 [JP] Japan ................... 51/76742

[51] Int. Cl.$^3$ ................... G03C 5/08; G03C 5/18
[52] U.S. Cl. ................... 430/142; 430/143; 430/158; 430/159; 430/162; 430/167; 430/253; 430/254; 430/273; 430/945
[58] Field of Search ............ 430/253, 254, 252, 273, 430/167, 143

[56] References Cited

U.S. PATENT DOCUMENTS

| | | | |
|---|---|---|---|
| 3,353,955 | 11/1967 | Colgrove | 430/255 |
| 3,395,014 | 7/1968 | Cohen et al. | 430/254 |
| 3,526,504 | 9/1970 | Celeste | 430/271 |
| 3,639,123 | 2/1972 | Gray | 430/254 |
| 3,671,236 | 6/1972 | Van Beusekom | 430/143 |
| 3,703,373 | 11/1972 | Alsop et al. | 430/254 |
| 3,721,557 | 3/1973 | Inoue | 430/257 |
| 3,770,438 | 11/1973 | Celeste | 430/253 |
| 3,782,939 | 1/1974 | Bonham et al. | 430/253 |
| 3,798,034 | 3/1974 | Laridon | 430/143 |
| 3,859,094 | 1/1975 | Franer et al. | 430/254 |
| 3,884,693 | 5/1975 | Bauer et al. | 430/263 |
| 4,008,084 | 2/1977 | Ikeda et al. | 430/276 |
| 4,041,204 | 8/1977 | Hepher et al. | 430/253 |
| 4,050,936 | 9/1977 | Takeda et al. | 430/253 |
| 4,081,282 | 3/1978 | Merrill et al. | 430/273 |
| 4,205,989 | 6/1980 | Moriya et al. | 430/253 |

FOREIGN PATENT DOCUMENTS 986773 4/1976 Canada ................... 430/253
52-126220 10/1977 Japan .

OTHER PUBLICATIONS

Chemical Abstracts, vol. 77, Abstract 95357y, 1972.

*Primary Examiner*—Charles L. Bowers, Jr.
*Attorney, Agent, or Firm*—Sughrue, Mion, Zinn, Macpeak and Seas

[57] ABSTRACT

A peel-apart-developable light-sensitive material comprising a light-sensitive element (a) comprising (i) a first support having coated thereon (ii) a thin layer and (iii) a light-sensitive composition layer in this order, in combination with an adhesive element (b) comprising (i) a second support having coated thereon (ii) an adhesive composition layer, wherein the thin layer (ii) has a different composition from the composition of the light-sensitive layer (iii) and having the capability that, where the light-sensitive composition layer (iii) is imagewise exposed to actinic radiation and then one of the first support (i) or the second support (i) is peeled from the combination of the light-sensitive element (a) and the adhesive element (b) laminated together in which the light-sensitive composition layer (iii) is adjacent the adhesive composition layer (ii), all of or a portion of the thin layer (ii) is peeled off with the second support (i), the adhesive composition layer (ii) and the light-sensitive composition layer (iii) with the thin layer (ii) being adhered selectively to the light-sensitive composition layer (iii) in correspondence with the imagewise exposure, and a method for forming images using the same.

15 Claims, No Drawings

PEEL-APART-DEVELOPABLE LIGHT-SENSITIVE MATERIALS AND IMAGE-FORMING METHOD USING THE SAME

This is a continuation of application Ser. No. 810,828, filed June 28, 1977, now abandoned.

BACKGROUND OF THE INVENTION

1. Field of the Invention

The present invention relates to an image-forming material and method, and more particularly, to a method for forming thin layer images by peel-apart-development of materials having a light-sensitive composition and a thin layer of which the adhesive properties thereof are changed by exposure to actinic radiation.

2. Description of the Prior Art

Image forming methods using the wet development of a thin layer or coating (e.g., a metal thin layer prepared using a vacuum plating method) and a light-sensitive resin, in combination for photographic images, printing images and relief images are widely known. Wet development methods after image-wise exposure, and materials therefor, are disclosed in Japanese Patent Publications Nos. 38,453/74 and 5,053/75, U.S. patent application Ser. No. 205,861, filed Dec. 8, 1971, now U.S. Pat. No. 4,113,494 (corresponding to Japanese Patent Application (OPI) No. 65,928/73) and Japanese Patent Application (OPI) No. 15,422/76. According to these methods, images can be obtained by exposing through an original to actinic radiation a light-sensitive material comprising a support having provided thereon a thin layer such as a metal layer and a light-sensitive layer to imagewise expose the light-sensitive layer according to the original image, and then developing the material to remove the exposed or unexposed areas of the light-sensitive layer, and furthermore, processing the material with a liquid capable of dissolving the thin layer to dissolve and remove the thin layer in the areas corresponding to the areas of the light-sensitive layer removed. These methods are not advantageous because two complicated wet processing steps, that is, removal of the unexposed light-sensitive layer and removal of the thin layer, are necessary. Materials and methods for improving the two-bath wet processing methods are disclosed in U.S. patent application Ser. No. 205,860, filed Dec. 8, 1971, now abandoned (corresponding to Japanese Patent Application (OPI) No. 65,927/73), U.S. patent application Ser. No. 350,372, filed Apr. 12, 1973 (corresponding to Japanese Patent Application (OPI) No. 2,925/75) and U.S. patent application Ser. No. 571,817, filed Apr. 25, 1975, now U.S. Pat. No. 4,008,084 (corresponding to Japanese Patent Application (OPI) No. 139,720/75). According to these methods, thin layer images can be obtained by exposing through an original to actinic radiation a light-sensitive material comprising a support having provided thereon a thin layer and a light-sensitive layer to imagewise expose the light-sensitive layer according to the original image and then processing the material with a developing solution to simultaneously remove either the exposed or unexposed areas of the light-sensitive layer and the thin layer.

These wet developing methods have the disadvantages that processing operations, for example, temperature control of the developing solution or exchange of the developing solution due to the fatigue thereof, are complicated and discharge of organic solvents from the developing solution causes pollution problems, because they include step or steps for removing the light-sensitive layer and the thin layer utilizing the difference in solubilities of the exposed and unexposed areas in the developing solution.

For the purposes of eliminating some of the defects of the wet developing methods, peeling-apart development methods and materials, which are considered to be dry developing methods, are disclosed in U.S. Pat. Nos. 3,353,955 and 3,770,438 and Japanese Patent Publications Nos. 9,663/63 and 43,126/73, and Japanese Patent Applications (OPI) Nos. 336,323/72 and 123,021/74. According to these methods, positive images and negative images can be obtained by exposing a light-sensitive material comprising a support having provided thereon a light-sensitive layer and a transparent thin synthetic resin film through an original to actinic radiation to imagewise expose the light-sensitive layer corresponding to the original image, and then peeling apart the transparent synthetic resin film. Other methods are known which comprise exposing through an original to actinic radiation a light-sensitive material comprising a transparent thin synthetic resin film having coated thereon a light-sensitive layer which is then provided on another support such as a support of a metal, glass, a synthetic resin sheet or paper to imagewise expose the light-sensitive layer corresponding to the original image, and then peeling apart the transparent synthetic resin film to provide negative images on one support and positive images on the other support. These peel-apart-development methods are interesting because of the ease of the developing operation and no pollution problems occur.

In the materials and methods as disclosed in the prior art, only the exposed or unexposed areas of the light-sensitive layer are removed from the support which has a larger mechanical strength by peeling apart the transparent synthetic resin film to form images comprising the light-sensitive composition. Further, U.S. patent application Ser. No. 571,817, filed Apr. 25, 1975 (corresponding to Japanese Patent Application (OPI) No. 139,720/75) discloses providing a metal thin layer between a support and a light-sensitive layer and selectively removing the light-sensitive layer corresponding to original image areas from the metal thin layer by a peel-apart-developing method. According to this method, the metal thin layer corresponding to the original image areas cannot be peeled apart with the light-sensitive layer from the support because of the adhesion between the peel-apart sheet and the light-sensitive layer, and the adhesion between the light-sensitive layer and the metal thin layer act together so that only the light-sensitive layer corresponding to original image areas is removed from the metal thin layer. A method in which a thin layer is selectively removed with a light-sensitive layer after imagewise exposure to form metal thin layer image areas corresponding to the original image areas by using a metal thin layer capable of being peeled apart from a support and having a weaker mechanical strength than the support has not been found.

SUMMARY OF THE INVENTION

As the result of research on materials and methods for preparing images of thin layers using a completely dry process, it was found that the above purpose can be achieved using light-sensitive materials, which are suitable for completely dry development and thin layer image formation, having an adhesive layer between a light-sensitive layer and a support and having a thin layer prepared using a selective combination of preparation methods and the thickness and other characteristics of the thin layer, and using image-forming methods comprising selectively peeling a thin layer with a light-sensitive layer corresponding to the original image areas from a support after imagewise exposure, whereby the present invention was completed.

The peel-apart-developable light-sensitive material of the invention comprises a light-sensitive element (a) comprising a first support (i) having coated thereon a thin layer (ii) and a light-sensitive composition layer (iii) in this order, and in combination, an adhesive element (b) comprising a second support (i) having coated thereon an adhesive composition layer (ii), the thin layer (ii) comprising a different composition from the composition of the light-sensitive layer (iii) and having the capability that, where the light-sensitive composition layer (iii) is imagewise exposed to actinic radiation and then one of the first support (i) or the second support (i) is peeled from the combination of the laminated elements (a) and (b) in which the light-sensitive composition layer (iii) is adjacent the adhesive composition layer (ii), all or a portion of the thin layer (ii) is peeled with the second support (i), the adhesive composition layer (ii) and the light-sensitive composition layer (iii) in a condition in which the thin layer (ii) is adhered selectively to the light-sensitive composition layer (iii) in correspondence with the imagewise exposure.

A preferred embodiment of the invention comprises a peel-apart-developable light-sensitive material as described above wherein the combination of the light-sensitive element (a) and the adhesive element (b) are laminated together such that the light-sensitive composition layer (iii) and the adhesive composition layer (ii) are laminated adjacent each other before imagewise exposing the light-sensitive composition layer (iii) to actinic radiation.

A further preferred embodiment of the invention comprises a peel-apart-developable light-sensitive material as described above wherein the combination of the light-sensitive element (a) and the adhesive element (b) are laminated together such that the light-sensitive composition layer (iii) and the adhesive composition layer (ii) are laminated adjacent each other after imagewise exposing the light-sensitive composition layer to actinic radiation.

Further, this invention provides a method for forming images which comprises imagewise exposing a peel-apart-developable light-sensitive material to actinic radiation, the light-sensitive material comprising a light-sensitive element (a) which comprises a first support (i) having coated thereon a thin layer (ii) and a light-sensitive composition layer (iii) in this order, with the thin layer (ii) having a different composition from the composition of the light-sensitive layer (iii), and an adhesive element (b) comprising a second support (i) having coated thereon an adhesive composition layer (ii), and the light-sensitive composition layer (iii) and the adhesive composition layer (ii) being adjacent each other before exposure, and peeling one of the first support (i) or the second support (i) from the light-sensitive material, and, optionally, during or after the exposure, heating, to remove all of or a portion of the thin layer (i) with the second support (i), the adhesive composition layer (ii) and the light-sensitive composition layer (iii) in which the thin layer (ii) is selectively adhered to the light-sensitive composition layer (iii) in correspondence with the imagewise exposure.

This invention also provides a method for forming images which comprises imagewise exposing a light-sensitive element (a) to actinic radiation, the element (a) comprising a support (i) having coated thereon a thin layer (ii) and a light-sensitive composition layer (iii) in this order, with the thin layer (ii) having a different composition from the composition of the light-sensitive layer (iii), laminating the element with an adhesive element (b) comprising a second support (i) having coated thereon an adhesive composition layer (ii), and the combination of the light-sensitive element (a) and the adhesive element (b) are laminated together so that the imagewise exposed light-sensitive composition layer (iii) and the adhesive composition layer (ii) are adjacent each other, and then peeling one of the first support (i) or the second support (i) from the laminated elements, and, optionally, during or after heating, to remove all of or a portion of the thin layer (ii) with the second support (i), the adhesive composition layer (ii) and the light-sensitive composition layer (iii) with the thin layer (ii) being adhered selectively to the light-sensitive composition layer (iii) in correspondence with the imagewise exposure.

DETAILED DESCRIPTION OF THE INVENTION

The invention is illustrated in greater detail below. In the description to follow for simplicity, the terms "lower support" and "upper support" will be respectively used to describe the first support and the second support, the terms "upper" being arbitrarily employed for simplicity of description.

In the present invention, when the adhesive force of the thin layer in the unexposed areas to the lower support, i.e., the first support, is smaller than that of the thin layer to the light-sensitive layer, that of the adhesive composition layer to the light-sensitive layer, that of the adhesive layer to the upper support, i.e., the second support, and is smaller than the cohesive force of each of the thin layer, the light-sensitive composition layer (i.e., the light-sensitive layer) and the adhesive composition layer, and when the adhesive force of the thin layer adjacent the exposed light-sensitive layer to the lower support becomes larger than one of the above-described adhesive forces and the cohesive forces, all of or a portion of the thin layer in the unexposed areas is selectively removed with the light-sensitive layer corresponding to the original image areas by peeling off the lower or upper support, whereby negative images are formed on the lower support and positive images are formed on the upper support. On the contrary, when the adhesive force of the thin layer in the unexposed areas to the lower support is larger than that of the thin layer to the light-sensitive layer, that of the adhesive composition layer to the light-sensitive layer, that of the adhesive layer to the upper support, and is larger than the cohesive force of each of the thin layer, the light-sensitive layer and the adhesive composition layer, and when the adhesive force of the thin layer adjacent the exposed light-sensitive layer to the lower support becomes smaller than one of the above-described adhesive forces and the cohesive forces, all of or a portion of the thin layer in the exposed areas is selectively removed with the light-sensitive layer corresponding to the original image areas by peeling off the lower or upper support after imagewise exposure, whereby positive images of the thin layer are formed on the lower support and negative images thereof are formed on the upper support.

In order to induce a change of the adhesion by exposing the light-sensitive material to actinic radiation, the light-sensitive composition has to change such that the strength of the adhesion between the light-sensitive layer and the adhesive composition layer, between the light-sensitive layer and the thin layer, or the cohesive force of each of the light-sensitive layer, the adhesive layer and the thin layer is changed by exposure. For the purpose, light-sensitive compositions which undergo a photo-chemical reaction, e.g., a photo-decomposition reaction, a photo-polymerization reaction or a photo-cross-linking reaction, can be used in the invention. Further, in order to control the balance of the adhesive forces desirably, it is preferred for the kind and amount of a tackifying agent to be added to the adhesive composition layer to be varied.

As is apparent from the above, in the light-sensitive materials and image-forming methods of the invention, a laminated material composed of the lower and upper supports and the thin layer, the light-sensitive layer and the adhesive composition layer provided therebetween is used and one of the supports is peeled apart, and for attaining the objects of the invention simply by the above means, the composition of each layer and the preparation of each layer (e.g., the thin layer) have to be appropriately selected. Many combinations and preparation methods can be used. That is, the invention is based on the discovery that, after imagewise exposure, the thin layer on the lower support is selectively removed from the lower support corresponding to the original image areas by the peeling-apart operation without employing a developing solution.

The desired properties of the lower support and the upper support differ corresponding to the imagewise exposing manner. Where imagewise exposure is carried out from the light-sensitive layer side, the lower support may be transparent or opaque to actinic radiation in the wavelength region to which the light-sensitive layer is sensitive.

Where imagewise exposure is carried out from the side of the light-sensitive layer before providing the upper support on the layers, the upper support may be transparent or opaque to actinic radiation, and where imagewise exposure is carried out after providing the upper support, the upper support must be transparent to actinic radiation. Further, where the thin layer on the lower support is transparent to actinic radiation in the wavelength region to which the light-sensitive layer is sensitive, imagewise exposure can be carried out from the lower support side before or after providing the upper support on the layers. In this case, the lower support must be transparent to actinic radiation but the upper support may be transparent or opaque. Regardless of the imagewise exposure technique to be carried out, at least one of the supports must be flexible so that the peel-apart operation can be conducted.

For imagewise exposure in this invention, a source of actinic radiation providing a large amount of actinic radiation may be used, for example, a mercury lamp or a xenon lamp which provides a large amount of actinic radiation in the near ultraviolet region to visible region, more specifically, at a wavelength of about 290 nm to about 650 nm. Since an optical system of the apparatus used for imagewise exposure is often glass, a light-sensitive composition sensitive to radiation in the wavelength region of about 290 nm (near ultraviolet region) to about 650 nm (visible region) is preferably employed in the invention. Therefore, it is preferred for the support on the side through which exposure is effected to be a transparent support having a transmission of not less than about 50% (preferably, not less than about 65%) of radiation of a wavelength of about 290 nm to about 650 nm.

Suitable supports which are transparent to actinic radiation and which are flexible include, for example, transparent synthetic resin films. Basically any synthetic resin material can be used if it has a molecular weight sufficiently large to be film-forming, e.g., above about 10,000, and is transparent. Typical examples of transparent synthetic resin films are high polymer films such as those of polyamides, polyolefins, vinyl polymers, polyesters or celluloses. Specific examples of synthetic resin films are those of polyhexamethylene sebacamide (nylon-6,10), polyhexamethylene adipamide (nylon-6,6), polycapramide (nylon-6), polyethylene, polypropylene, polyvinyl chloride, polyvinyl alcohol, polystyrene, polytetrafluoroethylene, vinyl chloride-vinylidene chloride copolymers, styrene-vinyl acetate copolymers, polyethylene terephthalate, ethylene terephthalateethylene isophthalate copolyesters, cellulose diacetate, cellulose triacetate, cellulose propionate, cellulose acetate propionate, cellulose acetate butyrate and viscose rayon. The thickness of the transparent synthetic resin film depends on the strength necessary for peeling apart without breaking in the peeling-apart-development. In general, a suitable thickness is about 6 μm to about 2 mm, preferably 8 μm to 0.5 mm.

Surface or surfaces of these flexible supports can be pre-treated using a corona discharging method, an ultraviolet light exposure method, a flame treatment method or a matting method.

Further, depending on the purpose of the light-sensitive materials, dyes or pigments which do not prevent the transmission of actinic radiation can be used to color the supports.

Suitable examples of rigid supports which are transparent to actinic radiation, which can be used in the invention, are glasses such as quartz glass or soda glass. Synthetic resins can also be used as rigid supports. Typical examples are acrylic glasses (e.g., (poly)methyl methacrylate), polystyrene, polyacrylonitrile, (poly)vinyl chloride, etc. Examples of flexible supports which are opaque to actinic radiation, which can be used in the invention, are papers, synthetic resin films (again the only requirement being film forming) containing dyes or pigments (e.g., titanium oxide, zinc oxide, calcium sulfate, calcium carbonate, barium sulfate, etc.), synthetic resin films of which the surface has been treated using the method as disclosed in, for example, Japanese Patent Publication No. 19,068/72, light-intercepting papers containing carbon black or dyes, and light-intercepting synthetic resin films containing carbon black or dyes. The surface of these supports can also be pre-treated using a corona discharge treatment, an ultraviolet light exposure treatment, a flame treatment, etc.

Examples of opaque and rigid supports include supports of metals (e.g., copper, aluminum, zinc, iron, stainless steel alloys, brass, etc.) and ceramic materials (e.g., earthen ware). The metal supports can be pre-treated using a surface oxidation treatment (e.g., an anodization) or a graining treatment (e.g., a sand-graining or a chemical etching).

The materials for the thin layer, which is composed of a different material from the composition of the light-sensitive layer, are not limited so long as suitable cohesive force exists, so long as an appropriate strength of adhesion of the lower support to the thin layer exists and so long as a suitable strength of adhesion of the thin layer to the light-sensitive layer exists so that the thin layer can be selectively removed with the light-sensitive layer from the lower support corresponding to the original image areas. Suitable materials for the thin layer include metals, inorganic compounds and organic compounds depending on the purpose thereof.

Representative examples of metals include iron, aluminum, tin, lead, gold, silver, copper, nickel, cadmium, chromium, zinc, magnesium and alloys of these metals.

Suitable inorganic compounds for the thin layer include metal oxides such as tin oxide, chromium oxide, iron oxide, aluminum oxide, zinc oxide or copper oxide; metal salts such as silver bromide, tin sulfide, silver sulfide or zinc sulfide; chalcogen glasses which are sintered materials containing a chalcogen element (e.g., arsenic, sulfur, germanium, tellurium, etc.) such as $As_2S_8$, $GeS$, $GeS_2$, $As_2Te_3$, $As_2Se_3$ or $SnS$; and sintered materials of metal oxides (e.g., ferrites).

Suitable organic compounds include colorants such as dyes or pigments; and polymers such as poly-N-vinylcarbazole.

The thin layer can be prepared by dispersing or dissolving the above metals, inorganic compounds or organic compounds in a high molecular weight material, e.g., in chlorinated polyethylene, chlorinated rubber, (poly)methyl methacrylate, etc.

The thin layer can be appropriately formed using well-known methods such as vacuum plating, sputtering, electron beam plating, ion plating, coating or chemical plating, e.g., as disclosed in L. I. Maissel and R. Glang, *Handbook of Thin Film Technology*, McGraw-Hill, New York (1971).

A suitable thickness of the thin layer different from the light-sensitive composition in the light-sensitive material and the image-forming method of the invention is about 20 nm to about 1 $\mu$m. Where the thin layer is formed using a metal or metal alloy, the thickness thereof is about 20 nm to about 120 nm. Where the thin layer is formed using a chalcogen glass, the thickness thereof is about 20 nm to about 700 nm. If the thickness thereof is less than about 20 nm, good images cannot be obtained by peeling-apart because a continuous layer is not formed, and if the thickness is more than about 1 $\mu$m, the thin layer does not imagewise remain on the lower support and the adhesive composition layer by breaking and separation at the image area boundaries, respectively.

Suitable light-sensitive materials for the light-sensitive composition of the invention include those disclosed in Jaromir Kosar *Light-Sensitive Systems*, John Wiley and Sons, Inc., New York (1965).

The light-sensitive materials employed in the invention can be classified into two groups. One group is a high molecular weight material having a cohesive force such that the thin layer on the lower support can be removed from the lower support, and the other group is a low molecular weight material having no cohesive force such that the thin layer on the lower support can be removed from the lower support. Examples of light-sensitive materials of the former type are photo-crosslinkable polymers having, in the side chain or main chain, a cinnamic acid group (e.g., polyvinyl cinnamate or $\beta$-hydroxyethyl ether of polycinnamic acid), a cinnamilidene group (e.g., polyvinyl cinnamilidene acetate), an azido group (e.g., polyazido vinylbenzoate or polyazido diphenylamine sulfonate), or an unsaturated ester group (e.g., maleic anhydride-ethylene glycol polycondensate); photo-decomposable polymers in which the functional group in the side chain is photo-decomposable, such as a diazo polymer (e.g., p-diazodiphenylamine-p-formaldehyde polycondensate); and photo-destroyable polymers of which the molecular structure is cleaved by exposure such as polymethyl vinyl ketone, as described in Chapter 4 of *Light-Sensitive Systems*, supra.

Where a low molecular weight material having no cohesive force necessary for removing the thin layer from the lower support is employed as the light-sensitive material, a binder capable of providing the light-sensitive layer with the cohesive force can be combined with the light-sensitive material. Examples of generally suitable binders include high molecular weight materials. Representative light-sensitive low molecular weight materials which can be used include photo-decomposable materials which are decomposed by exposure to actinic radiation, for example, o-quinonediazides, and o-naphthoquinonediazides (e.g., o-quinonediazide or 1,2-quinonediazide, o-naphthoquinonediazide or 1,2-naphthoquinonediazide, 3,4-quinolinequinone-3-diazide, 1,2-naphthoquinone-2-diazido-4-sulfonic acid phenyl ester, etc.), aromatic diazonium salts (e.g., benzenediazonium chloride, 2,5-dimethoxy-4-(p-tolylthio)-benzenediazonium chloride zinc chloride double salt, 2,5-diethoxy-4-(p-tolylthio)benzenediazonium chloride zinc chloride double salt, 2,5-dibutoxy-4-morpholinobenzenediazonium tetrafluoroborate, 2,5-dimethoxy-4-morpholinobenzenediazonium tetrafluoroborate, 1-hydroxy-5-sulfo-2-naphthalenediazonium salt, 2-hydroxy-5-nitro-4-sulfo-1-naphthalenediazonium salt, etc.), aromatic azido compounds (e.g., 2,6-bis(p-azidobenzal)-4-methyl-1-cyclohexanone, 4,4'-diazido-3,3'-dimethylbiphenyl, 4,4'-diazido-3,3'-dimethoxybiphenyl, 4,4'-diazido-3,3'-dichlorobiphenyl, 4,4'-diazido-3,3'-diethoxybiphenyl, 1-azidonaphthalene-4-sulfonyl chloride, p-azidoanisole, etc.), and ketone compounds (e.g., 1,3-triphenyl-2-propanone, etc.).

Examples of light-sensitive low molecular weight materials can further include materials capable of forming dimers or polymers by exposure to actinic radiation (e.g., vinyl cinnamate or anthracene) and compounds having an unsaturated double bond and capable of undergoing a photo-polymerizable chain reaction (e.g., methyl methacrylate, trimethylolpropane triacrylic acid ester, N-vinylcarbazole). Furthermore, materials undergoing a chain reaction by exposure to actinic radiation and decomposable thereby (e.g., $\alpha,\alpha,\alpha$-tribromoacetophenone) can be used depending on the purpose. The light-sensitive low molecular weight material can be used individually or in combination, and can be used with light-sensitive high molecular weight materials such as unsaturated polyesters or styrene. Of these low molecular weight materials, aromatic diazonium salts, o-quinonediazides, o-naphthoquinonediazides and aromatic diazido compounds are preferred.

Where the low molecular weight materials are employed as the light-sensitive material in the light-sensitive layer of the invention, high molecular weight materials must be used as a binder.

Examples of suitable high molecular weight binders include thermosetting polymers such as epoxy polymers or unsaturated polyesters, chlorinated hydrocarbon polymers such as polyvinyl chloride or chlorinated polyethylene, vinyl polymers such as polystyrene, polyesters such as polyethylene terephthalate, and thermoplastic polymers such as polybutadiene or polyethylene oxide. However, suitable binders are not to be construed as being limited to these examples. Of these binders, thermoplastic polymers having a glass transition temperature of about 110° C. or lower, particularly polyvinyl acetate, polyvinyl chloride and polyethylene oxide, are preferably used. As set forth in the Examples to follow, better results can be often obtained where thermoplastic polymers are used as the high molecular weight binder and, optionally, a heating step to a temperature of from about 50° C. to about 200° C., preferably, from 80° C. to 130° C., is carried out during or after laminating the adhesive layer on the upper support with the light-sensitive layer of the light-sensitive element which is composed of the lower support, the thin layer and the light-sensitive layer.

It is preferred, and sometimes necessary, in the invention for a sensitizer to be added to the light-sensitive layer to extend the wavelength region to which the light-sensitive layer is sensitive to longer wavelengths and to shorten the time required for imagewise exposure. A suitable amount of the sensitizer ranges from about 0.001 to about 10% by weight, preferably 0.1 to 3% by weight, based on the weight of the entire light-sensitive layer. Suitable sensitizers employed for the purpose can be selected from conventional sensitizers depending on the kinds and purposes of the light-sensitive materials. For example, Takahiro Tsunoda, *Light-Sensitive Resins*, Insatsugakkai Shuppanbu, Tokyo (1972) discloses that 2-nitrofluorene, 5-nitroacenaphthene and anthraquinones sensitize polyvinyl cinnamate; pyrilium salts and 1-nitropyrene sensitize azido compounds; and carbonyl compounds (e.g., benzophenone or benzyl), azo compounds (e.g., azobisisobutyronitrile) and halogen compounds (e.g., carbon tetrachloride or 2-naphthalene sulfonylchloride) sensitize acrylates having a polymerizable unsaturated bond and are preferably employed.

A stabilizer may be added to the light-sensitive composition to improve stability in storage. Examples of suitable stabilizers include the well-known thermal polymerization inhibitors such as p-methoxyphenol, hydroquinone or phenothiazine which are preferably used for photopolymerizable acrylates in an amount of about 0.01 to about 5% by weight, preferably 0.05 to 1% by weight, based on the weight of the acrylates.

A tackifying agent, a plasticizer and a colorant may be added to the light-sensitive composition. The tackifying agent and the plasticizer may be the same as those in the adhesive composition layer to be described below. Examples of colorants are, for example, phthalocyanine type pigments, azo pigments and other pigments; and triphenylmethane type dyes, anthraquinone type dyes and other dyes. It is particularly preferred for the colorants to be employed to not absorb actinic radiation in the wavelength to which the light-sensitive composition is sensitive. The tackifying agent can be used in an amount of about 1 to about 60% by weight, preferably 10 to 40% by weight, based on the total weight of the light-sensitive layer. The plasticizer can be used in an amount of about 0.1 to about 50% by weight, preferably 3 to 30% by weight, based on the total weight of the light-sensitive layer. The colorant can be used in an amount of about 0.0001 to about 10% by weight, preferably 0.01 to 1% by weight, based on the total weight of the light-sensitive layer.

In general, the light-sensitive composition of the invention is dissolved in a solvent to provide a coating composition, coated on the thin layer provided on the lower support, and dried. In this invention, the photosensitive material can be used in an amount of about 1 to about 500% by weight, preferably 30 to 200% by weight, based on the weight of the binder. The amount of the photosensitive material coated is defined basically by the thickness of the coated layer. A suitable thickness for the photosensitive layer is a thickness of about 0.5 m$\mu$ to 100 m$\mu$, preferably 1 m$\mu$ to 10 m$\mu$, more preferably 2 m$\mu$ to 6 m$\mu$.

Suitable solvents for the coating composition are those which dissolve the light-sensitive composition and which do not damage the thin layer provided on the lower support. Where the thin layer on the lower support is a metal or an inorganic compound, suitable solvents include alcohols such as ethyl alcohol or methyl alcohol, ketones such as acetone or methyl ethyl ketone, esters such as ethyl acetate or butyl acetate, and aromatic hydrocarbons such as toluene or xylene. Where the thin layer on the lower support contains an organic substance, a careful selection is required so that the thin layer is not markedly damaged and mixed with the light-sensitive layer, or by dissolving or swelling the thin layer. A thin layer different from the thin layer provided on the lower support can be provided between the thin layer and the light-sensitive composition layer so that the light-sensitive layer can be easily coated on the thin layer. Suitable examples of materials which can be used for this thin layer provided between the thin layer and the light-sensitive layer include organic polymer compounds such as (poly)methyl methacrylate, polyesters of (poly)vinyl alcohol having a molecular weight less than about 30,000, cellulose triacetate and the like.

The adhesive composition employed in the invention can include a high molecular weight material and a tackifying agent. Suitable high molecular weight materials include rubber type high molecular weight materials, cellulose type high molecular weight materials and vinyl type high molecular weight materials. Exemplary rubber type high molecular weight materials include natural rubber, butadiene-styrene rubber, isobutylene-isoprene rubber, polychloroprene, polybutylene, polybutadiene, polyisoprene, butadiene-acrylonitrile rubber, chlorinated rubber and silicone rubber. Exemplary cellulose type high molecular weight materials include ethyl cellulose, butyl cellulose, nitrocellulose, benzyl cellulose, cellulose diacetate, cellulose propionate, cellulose acetate propionate and cellulose acetate butyrate. Representative vinyl type high molecular weight materials include polyvinyl chloride, polyacrylate, polymethyl acrylate, polyethyl acrylate, polybutyl acrylate, polymethacrylate, polymethyl methacrylate, polyvinyl ether, polyvinyl acetal and copolymers thereof. The high molecular weight material can be used in an amount of from about 5% to about 97% by weight, preferably 20% to 90% by weight, based on the total weight of the adhesive layer.

Suitable examples of tackifying agents are gum rosin, wood rosin, hydrogenated rosin, methyl abietate, hydrogenated methyl abietate, diethylene glycol abietate, diethylene glycol 2-hydroabietate, monoethylene glycol ester of rosin, pentaerythritol ester of rosin, glycerol ester of rosin, methanol ester of rosin, hydrogenated esters of the above rosins, other rosins, coumarone-indene resins, alkyd resins, terpene resins (e.g., poly(1,8-p-menthadiene)), xylene resins, epoxy resins, terpene-phenol resins, polybutene, polypentene, dammar, copal, animal oils and fats, vegetable oils and fats and mineral oils. The tackifying agent can be used in an amount of from about 1% to about 70% by weight, preferably 10% to 50% by weight, based on the total weight of the adhesive layer.

Where rubber type and vinyl type high molecular weight materials are employed, it is necessary to add a plasticizer to the adhesive composition. Suitable plasticizers include dimethyl phthalate, diethyl phthalate, dibutyl phthalate, dioctyl phthalate, dicyclohexyl phthalate, dimethylglycol phthalate, butylphthalylbutyl glycolate, triethylene glycol, diphenyl chloride, diisobutyl adipate and dimethyl sebacate.

The adhesive composition may further contain an antioxidant, a colorant, an inorganic or organic filler, etc. The antioxidant can be used in an amount of from about 0.001% to about 20% by weight, preferably 0.01% to 5% by weight, based on the total weight of the adhesive layer. The colorant can be used in an amount of from about 0.0001% to about 10% by weight, preferably 0.01% to 1% by weight, based on the total weight of the adhesive layer. The inorganic filler can be used in an amount of from about 0.1% to about 70% by weight, preferably 2% to 50% by weight, based on the total weight of the adhesive layer. The adhesive composition is dissolved in a solvent, for example, an aromatic hydrocarbon such as benzene, toluene, ethyl benzene or xylene, an aliphatic hydrocarbon such as pentane, cyclohexane, octane or methyl cyclohexane, an ether such as dimethyl ether, diethyl ether or tetrahydrofuran, a halogenated hydrocarbon, etc., is coated on the upper support using conventional methods, and then dried. A suitable dry thickness of the adhesive layer is about 0.5 $\mu$m to about 50 $\mu$m, preferably 1 $\mu$m to 20 $\mu$m.

The most easily used adhesive layer is a commercially available pressure-adhesive tape or sheet comprising a support such as cellophane, paper, cloth, polyester, polyvinyl chloride, etc.

The method of preparing the materials of the invention is explained in the following. The order of preparation should not be construed as being limited to the following method and the preparation method of the invention can include methods in which the following order or steps are changed and modified by one skilled in the art using conventional methods.

As described above, the light-sensitive element (a) which comprises the light-sensitive composition layer and the thin layer on the lower support, and the adhesive element (b) which comprises the adhesive composition layer on the upper support are combined and uniformly laminated by applying a pressure, e.g., about 0.1 to about 50 kg/cm$^2$, preferably 1 to 20 kg/cm$^2$, thereto so that the light-sensitive composition layer is contacted with the adhesive composition layer. In this case, a laminator is preferably used so that the two laminated elements are uniformly laminated (e.g., with no entrapped air). A suitable temperature for the lamination is about 0° C. to about 150° C., preferably 15° C. to 100° C.

The thus-prepared material of the invention is imagewise exposed and developed as follows:

An original to be copied is brought into close contact with the transparent upper support and the light-sensitive material is imagewise exposed through the original to actinic radiation. The imagewise exposure can be carried out from the side of the lower support as long as the lower support and the thin layer are transparent to actinic radiation used. For some purposes, the imagewise exposure can be carried out before laminating the adhesive element (b) onto the light-sensitive element (a).

In addition to the above closely contact exposure, a conventional manner by using CRT may be carried out. Suitable imagewise exposure techniques which can be used in the present invention include, in addition to those detailed herein, exposure by projection through a lens system using an original image to imagewise expose the light-sensitive layer (conventional enlarging techniques, and also including actual size or reduced size projection techniques) and scanning exposure techniques using a laser beam. The exposure time will, of course, vary depending upon the strength (the amount of energy per unit area) of the actinic radiation used for irradiation and can easily be determined by those skilled in the art using routine tests. However, to facilitate the exposure operation, the exposure time is usually adjusted to a period of time within about 0.1 to about 60 seconds, preferably 0.5 to 30 seconds, more preferably 1 to 20 seconds.

Then, the development is carried out by peeling the flexible upper or lower support from the light-sensitive material, i.e., the laminated combination of elements (a) and (b).

The light-sensitive material of the invention can be heated after the imagewise exposure step and prior to the peeling-apart-operation in order to adjust the adhesion force between the thin layer and light-sensitive layer and that between the light-sensitive composition layer and the adhesive composition layer. This heating operation may be practiced by bringing the material into close contact with a heated plate or exposing the material to infrared light. If a laser beam is employed, the imagewise exposure step and the heating operation can be conducted simultaneously. By the above method or operation, positive images are formed on the upper support and negative images are formed on the lower support, if the thin layer corresponding to opaque images of the original remains on the upper support, and negative images are formed on the upper support and positives images are formed on the lower support, if the thin layer corresponding to transparent images of the original remains on the upper support. Whether negative or positive images are formed on the lower support is decided by the properties of the light-sensitive components and the image formation operations.

As is apparent from the above-described operation, the method of the invention provides a completely dry process which has not been attained in the art by imagewise peeling the thin layer on the lower support. The method of the invention is quite advantageous from the standpoint of minimizing pollution problems and ease of developing operations than conventional wet processing methods, and images formed by the invention can be applied to broader purposes in addition to photographic use by selecting the materials for the thin layer. For example, the invention can be applied to the formation of thin layer images useful as an electroconductive pattern for a printed circuit (if metals such as copper or aluminum are used as the material for the thin layer), as an electric resistance pattern (if iron or nickel-chromium is used), as a magnetic pattern (if a ferromagnetic material such as nickel, chromium or a ferrite is used), as a transparent electrode pattern (if a transparent metal oxide such as tin oxide is used), as a photoconductive electrode pattern (if a photoconductor such as zinc oxide or chalcogen glass is used), and to the formation of printing plates such as lithographic plates, relief printing plates or gravure printing plates.

According to the invention, either negative images or positive images which correspond to the original images are formed by changing the kind of binders in the light-sensitive layer or by changing the image-forming operations or steps. Further, according to the invention, halftone images which have not been formed by conventional wet processing methods can be formed, while continuous tone images can be also formed by selecting the light-sensitive layer and/or the heating and/or peeling conditions.

The invention will be explained in more detail by reference to the following Examples. Unless otherwise indicated, all parts, percents, ratios and the like are by weight.

EXAMPLE 1

500 mg of polyvinyl acetate (average polymerization degree: 3,000, tradename: CEVIAN A-type 008, manufactured by Daicel Co., Ltd.) and 400 mg of a diazonium salt represented by the following formula:

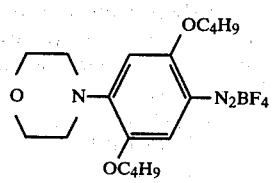

were dissolved in 12 ml of mixture of acetone and methanol (volume ratio: 1:5). This light-sensitive composition was coated on a vacuum plated aluminum layer having a thickness of 50 nm which was provided on a polyethylene terephthalate film having a thickness of 50 μm (lower support) using a coating rod to provide a light-sensitive element. The thickness of the light-sensitive layer was 4 μm after drying for 10 minutes at 80° C. On this light-sensitive layer, an adhesive element which was a commercially available adhesive tape (tradename: Sekisui Polyester Film, manufactured by Sekisui Co. Ltd., a polyethylene terephthalate support having a thickness of 25 μm and an adhesive composition layer of a thickness of about 16 μm) was laminated at room temperature (23° C.) using a pressure roll under a pressure of about 5 kg/cm² to prepare the light-sensitive material of the invention. A transparent original having images therein was closely contacted with the upper support of the adhesive element, and then the assembly was exposed from the side of the upper support to light from a 250 w ultra-high pressure mercury lamp (manufactured by Ushio Electric Co., Ltd.) with a separation distance of 30 cm from the light source for 30 seconds. Directly after the exposure, the adhesive element was peeled apart from the light-sensitive material, whereby negative aluminum thin layer images were formed on the lower support and positive aluminum thin layer images were formed on the adhesive element. The thus-obtained images had a good resolving power for lines of a 50 μm width. The image of the thin layer did not transmit visible light therethrough and the images had high contrast.

EXAMPLE 2

The same procedure as described in Example 1 was repeated with the following modifications. The original was closely contacted with the light-sensitive layer before laminating the adhesive element on the light-sensitive layer, the imagewise exposure was conducted for 25 seconds and the adhesive element was laminated on the light-sensitive layer using a pressure roll under a pressure of about 5 kg/cm² heated to 120° C. after imagewise exposure and then the adhesive element was peeled apart after cooling the material to room temperature (23° C.). As a result, positive images of the aluminum thin layer corresponding to the images of the original were formed on the lower support and negative images of the aluminum thin layer corresponding to the images of the original were formed on the adhesive element. The thus-formed images were found to have good quality comparable to that obtained in Example 1.

EXAMPLE 3

500 mg of polyethylene oxide (average molecular weight: 400,000, tradename: ALKOX E-30, manufactured by Meisei Chemical Co., Ltd.) and 200 mg of a diazonium salt represented by the following formula:

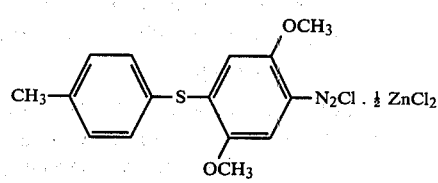

were dissolved in 13.5 g of dimethylformamide.

This light-sensitive composition was coated on an aluminum-vacuum plated layer just as in Example 1 using a coating rod to provide a light-sensitive element. After drying for 10 minutes at 80° C., the thickness of the light-sensitive layer was 5 μm. A transparent original having images therein was closely contacted with the light-sensitive layer and the assembly was exposed for 30 seconds similar to Example 1. The adhesive element described in Example 1 was laminated on the imagewise exposed light-sensitive layer at room temperature (23° C.) using a pressure roll under a pressure of about 5 kg/cm². The thus-obtained light-sensitive material was heated for 1 minute at 100° C. and then allowed to stand at room temperature (23° C.). By immediately peeling off the adhesive element, positive images of the aluminum vacuum plating layer were formed on the lower support and negative images were formed on the adhesive element. The thus-formed images were found to have good quality comparable to that obtained in Example 1.

EXAMPLE 4

500 mg of polyvinyl chloride (softening point: 100° C., tradename: Zeon 25, manufactured by Nippon Zeon Co., Ltd.) and 200 mg of a diazonium salt represented by the following formula:

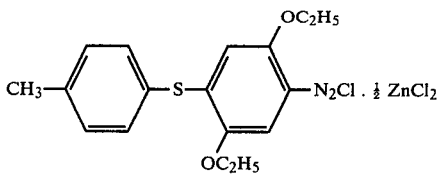

were dissolved in 14 g of tetrahydrofuran. This light-sensitive composition was coated on an aluminum-vacuum plated layer just as in Example 1 using a coating rod and then dried for 10 minutes at 50° C. to prepare a light-sensitive element. The thickness of the dried light-sensitive layer was 3 μm.

An image-bearing transparent original was closely contacted with the light-sensitive layer, and then the assembly was exposed as in Example 1 for 30 seconds. Then, the adhesive element described in Example 1 was laminated on the exposed light-sensitive layer at room temperature (23° C.) using a pressure roll under a pressure of about 5 kg/cm². After the thus-obtained material was heated for 1 minute at 100° C., it was allowed to stand at room temperature (23° C.), and then the adhesive tape was immediately peeled apart, whereby positive images of the aluminum vacuum-plating layer and negative images thereof were formed on the lower support and on the adhesive element, respectively. The thus-formed images were found to have good quality comparable to that obtained in Example 1.

EXAMPLE 5

500 mg of polyvinyl chloride (softening point: 100° C., tradename: Zeon 25, manufactured by Nippon Zeon Co., Ltd.) and 200 mg of a diazido compound represented by the formula:

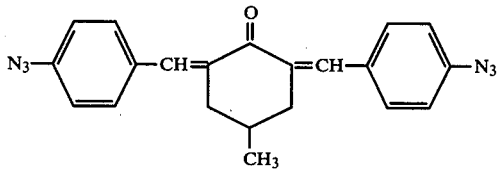

were dissolved in 14 g of tetrahydrofuran.

The light-sensitive composition was coated on an aluminum vacuum-plated layer just as in Example 1 using a coating rod to prepare a light-sensitive element. After drying for 10 minutes at 80° C., the thickness of the light-sensitive layer was 3 μm. An image-bearing transparent original was closely contacted with the light-sensitive layer, and then the assembly was exposed for 30 seconds in the same manner as in Example 1. Then, the same adhesive element as described in Example 1 was laminated on the imagewise exposed light-sensitive layer at room temperature (23° C.) using a pressure roll. The thus-obtained light-sensitive material was heated for 1 minute at 100° C. and then cooled by allowing it to stand at room temperature (23° C.). The adhesive element was immediately peeled apart, whereby positive images of the aluminum vacuum-plated layer were formed on the lower support, and negative images thereof were formed on the adhesive element. The thus-formed images were found to have good quality comparable to that obtained in Example 1.

EXAMPLE 6

500 mg of polyvinyl chloride as described in Example 5 and 200 mg of a diazido compound represented by the following formula:

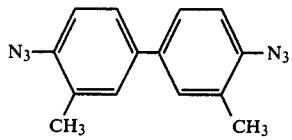

were dissolved in 14 g of tetrahydrofuran. The light-sensitive composition was coated on the same type of aluminum vacuum-plated layer as in Example 1 using a coating rod to prepare a light-sensitive element. The thickness of the light-sensitive layer was 3 μm after drying for 10 minutes at 80° C. An image-bearing transparent original was closely contacted with the light-sensitive layer and then the assembly was exposed for 30 seconds in the same manner as in Example 1. Then, the same adhesive element as described in Example 1 was laminated on the imagewise exposed light-sensitive layer at room temperature (23° C.) using a pressure roll under a pressure of about 5 kg/cm². The light-sensitive material was heated for 1 minute at 100° C., and then allowed to stand at room temperature (23° C.), where positive images of the aluminum vacuum-plating layer were formed on the lower support and negative images thereof were formed on the adhesive element. The thus-formed images were found to have good quality comparable to that obtained in Example 1.

EXAMPLE 7

A silver halide negative halftone photographic image original was closely contacted with the light-sensitive layer of the same type of light-sensitive element as described in Example 6, and then exposed for 30 seconds in the same manner as in Example 1. Then, the same type of adhesive element as described in Example 1 was laminated on the imagewise exposed light-sensitive layer at room temperature (24° C.) using a pressure roll under a pressure of about 5 kg/cm². The thus-obtained light-sensitive material was heated for 1 minute at 100° C. on a heated plate, and then allowed to stand at room temperature (24° C.). The adhesive element was immediately peeled apart, whereby positive halftone images of the aluminum vacuum-plated layer were formed on the lower support and halftone negative images thereof were formed on the adhesive element. The thus-formed images were found to have good quality comparable to that obtained in Example 1.

EXAMPLE 8

A nickel vacuum-plated layer having a thickness of 100 mμ was formed on a polyethylene terephthalate film (lower support) having a thickness of 50 μm. The light-sensitive composition as described in Example 6 was coated on the nickel layer using a coating rod to prepare a light-sensitive element. After drying the material for 10 minutes at 50° C., the thickness of the light-sensitive layer was 3 μm. An original having images therein was closely contacted with the light-sensitive layer, and the assembly was exposed for 30 seconds in the same manner as in Example 1. Then, the same adhesive element as described in Example 1 was laminated on the imagewise exposed light-sensitive layer at room temperature (23° C.) using a pressure roll under a pressure of about 5 kg/cm². The thus-formed light-sensitive material was heated in a dryer thermostatically controlled to 100° C. for 1 minute, allowed to stand at room temperature (23° C.) was peeled apart, whereby positive images of the nickel vacuum-plated layer corresponding to the original and negative images thereof were formed on the lower support and the adhesive element, respectively. The thus-formed images were found to have good quality comparable to that obtained in Example 1.

EXAMPLE 9

A copper vacuum-plated layer having a thickness of 50 mµ was formed on a polyethylene terephthalate film (lower support) having a thickness of 50 µm using a vacuum-plating method, on which the same light-sensitive composition as described in Example 6 was coated using a coating rod to prepare a light-sensitive element. After drying for 10 minutes at 100° C., the thickness of the light-sensitive layer was 3 µm. An image-bearing transparent original was closely contacted with the light-sensitive layer and then the assembly was imagewise exposed for 30 seconds in the same manner as in Example 1. Then, the same adhesive element (adhesive tape) as described in Example 1 was laminated on the imagewise exposed light-sensitive layer at room temperature (23° C.) using a pressure roll under a pressure of about 5 kg/cm². The light-sensitive material was heated in a dryer thermostatically controlled to 100° C. for 1 minute, and then allowed to stand at room temperature (23° C.). Immediately after cooling the material, the adhesive element was peeled apart, whereby positive images of the vacuum plated layer corresponding to the original and negative images thereof were formed on the lower support and on the adhesive element, respectively. The thus-formed images were found to have good quality comparable to that obtained in Example 1.

EXAMPLE 10

A nickel-chromium alloy layer composed at 80 wt% of nickel and 20 wt% of chromium and having a thickness of 100 mµ was provided on a polyethylene terephthalate film (lower support) having a thickness of 50 µm using a vacuum-plating method, on which the same light-sensitive composition as described in Example 6 was coated using a coating rod to prepare a light-sensitive element. After drying the material for 10 minutes at 50° C., the thickness of the light-sensitive layer was 3 µm. An image-bearing original was closely contacted with the light-sensitive layer, and exposed for 30 seconds in the same manner as in Example 1. Then, the same adhesive element as described in Example 1 was laminated on the imagewise exposed light-sensitive layer at room temperature (23° C.) using a pressure roll under a pressure of about 5 kg/cm². The thus-obtained light-sensitive material was heated in a dryer thermostatically controlled to 100° C. for 1 minute, and then cooled by being allowed to stand at room temperature (23° C.). The adhesive element was immediately peeled apart, whereby positive images of the nickel-chromium vacuum-plated layer and negative images thereof were formed on the lower support and on the adhesive element, respectively. The thus-formed images were found to have good quality comparable to that obtained in Example 1.

EXAMPLE 11

A chalcogen glass layer of 20% of arsenic and 80% of sulfur and having a thickness of 100 mµ was provided on a polyethylene terephthalate film (lower support) having a thickness of 50 µm, on which the light-sensitive composition as described in Example 6 was coated using a coating rod to prepare a light-sensitive element. After drying the material for 10 minutes at 50° C., the thickness of the light-sensitive layer was 3 µm. An image-bearing transparent original was closely contacted with the light-sensitive layer and the assembly was exposed for 30 seconds in the same manner as in Example 1. Then, the same adhesive element (adhesive tape) as described in Example 1 was laminated on the light-sensitive layer at room temperature (23° C.) using a pressure roll under a pressure of about 5 kg/cm². The thus-obtained light-sensitive material was heated in a dryer thermostatically controlled to 100° C. for 1 minute, and then cooled by allowing the material to stand. The adhesive element was immediately peeled apart, whereby positive images of the chalcogen glass vacuum-plated layer and negative images thereof were formed on the lower support and on the adhesive element, respectively. The thus-formed images were found to have good quality comparable to that obtained in Example 1.

EXAMPLE 12

A solution for an adhesive composition layer having the following formulation was prepared.
Natural Rubber (smoked sheet): 10 g
Glycerol Ester of Hydrogenated Rosin: 10 g
Toluene: 60 ml The adhesive composition was coated on a polyethylene terephthalate film (upper support) having a thickness of 100 µm, and dried for 20 minutes at 90° C. to prepare an adhesive element. After drying, the thickness of the adhesive layer was 3 µm.

The adhesive element was laminated on the imagewise exposed light-sensitive layer of a light-sensitive element prepared as described in Example 9 using a pressure roll under a pressure of about 5 kg/cm².

The thus-prepared light-sensitive material was heated for 2 minutes at 100° C., and then cooled by allowing the material to stand at room temperature (24° C.). The adhesive element was immediately peeled apart, whereby positive images of the copper vacuum-plated layer corresponding to the original and negative images thereof were formed on the lower support and on the adhesive element, respectively. The thus-formed images were found to have good quality comparable to that obtained in Example 1.

EXAMPLE 13

The same procedure as described in Example 1 was repeated with the following modifications. The original was closely contacted with the light-sensitive layer before laminating the adhesive element on the light-sensitive layer, the imagewise exposure was conducted for 25 seconds and the adhesive element was laminated on the light-sensitive layer using a pressure roll under a pressure of about 5 kg/cm² at room temperature (23° C.) after imagewise exposure and then the adhesive element was peeled apart at room temperature (23° C.). As a result, negative images of the aluminum thin layer corresponding to the images of the original were formed on the lower support and positive images of the aluminum thin layer corresponding to the images of the original were formed on the adhesive element. The thus-formed images were found to have good quality comparable to that obtained in Example 1.

While the invention has been described in detail and with reference to specific embodiments thereof, it will be apparent to one skilled in the art that various changes and modifications can be made therein without departing from the spirit and scope thereof.

What is claimed is:

1. A method for forming images which consists of imagewise exposing through an original for a period of about 0.1 seconds to about 60 seconds a light-sensitive element (a) to actinic radiation, said light-sensitive element (a) comprising (i) a first support having coated thereon (ii) a thin layer of a metal or a metal alloy and (iii) a light sensitive composition layer which comprises as a binder at least one organic high molecular weight material having a glass transition temperature of about 110° C. or less selected from the group consisting of polyvinyl acetate, polyvinyl chloride and polyethylene oxide and, as a light-sensitive compound, at least one aromatic azido compound in this order, wherein said actinic radiation decomposes said azido compound; laminating said imagewise exposed light-sensitive element (a) with an adhesive element (b) comprising (i) a second support having coated thereon (ii) an adhesive composition layer having a thickness of about 0.5 μm to about 50 μm, so that the light-sensitive composition layer (iii) of said imagewise exposed light-sensitive element (a) and the adhesive composition layer (ii) of said adhesive element (b) are adjacent each other; heating the product of said laminating to about 100° C. to about 120° C. for 2 minutes or less and then peeling apart, after the product has cooled to room temperature, one of said first support (i) or said second support (ii) from the product whereby a positive opaque metal or metal alloy image of said original is formed on said first support (i) and a negative opaque metal or metal alloy image of said original is formed on said light-sensitive composition layer (iii) said second support, where at least one of said first support and said second support is flexible and functions as the support which peels apart from said product.

2. The method as claimed in claim 1, wherein the metal or metal alloy is aluminum, magnesium, zinc, lead, tin, gold, silver, copper, iron, nickel, chromium or an alloy thereof.

3. The method as claimed in claim 1, wherein the metal or metal alloy is aluminum, copper, nickel or a nickel-chromium alloy.

4. The method as claimed in claim 1, wherein the thin layer (ii) comprises a vacuum plated layer, a sputtered layer, an electron beam plated layer or an ion plated layer.

5. The method as claimed in claim 1, wherein the first support (i) on which the thin layer (ii) is provided is a polyethylene terephthalate film.

6. The method as claimed in claim 1, wherein the second support (i) on which said adhesive composition layer (ii) is provided is a polyethylene terephthalate film.

7. The method as claimed in claim 1, wherein the adhesive composition layer (ii) contains a high molecular weight material and a tackifying agent.

8. The method as claimed in claim 7, wherein the tackifying agent is at least one rosin type material.

9. The method as claimed in claim 7, wherein the high molecular weight material is at least one of a rubber type high molecular weight material, a cellulose type high molecular weight material and a vinyl type high molecular weight material.

10. The method as claimed in claim 7, wherein the adhesive composition layer (ii) additionally contains a plasticizer.

11. The method as claimed in claim 1, wherein the thin layer (ii) has a thickness of about 50 nm to about 100 nm.

12. The method as claimed in claim 1, wherein the adhesive element (b) is an adhesive tape consisting essentially of a polyethylene terephthalate support and an adhesive composition layer.

13. The method as claimed in claim 1, wherein said organic high molecular weight material is polyvinyl chloride, said aromatic azide compound is a bisazide compound, and a positive image of said metal or metal image is formed on said first support and a negative image of said metal or metal alloy image is formed on said light-sensitive composition layer.

14. The method as claimed in claim 1, wherein the thin layer (ii) has a thickness of about 20 nm to about 120 nm.

15. The method as claimed in claim 1, wherein said thin layer of a metal or metal alloy has a thickness of about 20 nm to about 120 nm and wherein said light-sensitive composition layer has a thickness of about 0.5 μm to about 100 μm.

* * * * *